United States Patent
Ngwendson

(10) Patent No.: US 12,471,327 B2
(45) Date of Patent: Nov. 11, 2025

(54) SEMICONDUCTOR DEVICE

(71) Applicants: DYNEX SEMICONDUCTOR LIMITED, Lincoln (GB); ZHUZHOU CRRC TIMES SEMICONDUCTOR CO. LTD, Zhuzhou (CN)

(72) Inventor: Luther-King Ngwendson, Lincoln (GB)

(73) Assignees: DYNEX SEMICONDUCTOR LIMITED, Lincoln (GB); ZHUZHOU CRRC TIMES SEMICONDUCTOR CO. LTD, Zhuzhou (CN)

( * ) Notice: Subject to any disclaimer, the term of this patent is extended or adjusted under 35 U.S.C. 154(b) by 0 days.

(21) Appl. No.: 18/009,424

(22) PCT Filed: Sep. 29, 2021

(86) PCT No.: PCT/EP2021/076871
§ 371 (c)(1),
(2) Date: Dec. 9, 2022

(87) PCT Pub. No.: WO2023/051911
PCT Pub. Date: Apr. 6, 2023

(65) Prior Publication Data
US 2024/0213310 A1 Jun. 27, 2024

(51) Int. Cl.
*H10D 62/10* (2025.01)
*H01L 21/02* (2006.01)

(52) U.S. Cl.
CPC ..... *H10D 62/106* (2025.01); *H01L 21/02554* (2013.01); *H10D 62/125* (2025.01)

(58) Field of Classification Search
CPC ................ H10D 62/106; H10D 62/125; H01L 21/02554
See application file for complete search history.

(56) References Cited

U.S. PATENT DOCUMENTS

| | | | |
|---|---|---|---|
| 4,009,483 A | 2/1977 | Clark | |
| 5,093,693 A | 3/1992 | Abbas | |
| (Continued) | | | |

FOREIGN PATENT DOCUMENTS

| | | |
|---|---|---|
| CN | 102263124 A | 11/2011 |
| EP | 0693772 A2 | 1/1996 |
| JP | S6211272 A | 1/1987 |

OTHER PUBLICATIONS

International Search Report and Written Opinion issued in connection with corresponding PCT Patent Application No. PCT/EP2021/076871 dated May 31, 2022.

(Continued)

*Primary Examiner* — Fernando L Toledo
*Assistant Examiner* — Ryan T. Fortin
(74) *Attorney, Agent, or Firm* — Tarolli, Sundheim, Covell & Tummino LLP

(57) ABSTRACT

We herein describe a power semiconductor device having a semiconductor substrate including an active region and an edge termination region surrounding the active region, an edge termination structure located in the edge termination region of the semiconductor substrate, and a plurality of oxide segments located over the upper surface of the edge termination region of the semiconductor substrate, where the plurality of oxide segments are laterally spaced from each other. The power semiconductor device also includes a charge dissipation layer located over the upper surface of the edge termination region of the semiconductor substrate and the plurality of oxide segments, such that the charge dissipation layer is in contact with the upper surface of the semiconductor substrate only at a plurality of interface regions, where the interface regions comprise regions of the semiconductor substrate located laterally between adjacent oxide segments.

16 Claims, 3 Drawing Sheets

(56) References Cited

U.S. PATENT DOCUMENTS

| | | | |
|---|---|---|---|
| 6,215,168 B1 | 4/2001 | Brush | |
| 8,476,691 B1 | 7/2013 | Sdrulla | |
| 9,171,917 B2 | 10/2015 | Bobde | |
| 2009/0302376 A1 | 12/2009 | Inoue | |
| 2011/0248284 A1 | 10/2011 | Carta | |
| 2015/0001719 A1* | 1/2015 | Schmidt | H10D 64/117 |
| | | | 257/751 |
| 2015/0349144 A1 | 12/2015 | Kawano | |
| 2016/0020308 A1* | 1/2016 | Turner | H10D 12/441 |
| | | | 438/138 |
| 2017/0148870 A1* | 5/2017 | Huang | H10D 30/665 |
| 2018/0130874 A1 | 5/2018 | Takaoka | |
| 2019/0172944 A1* | 6/2019 | Okumura | H10D 30/665 |
| 2020/0295178 A1 | 9/2020 | Chen | |
| 2021/0074824 A1 | 3/2021 | Matsushita | |

OTHER PUBLICATIONS

Bose J V S C et al: "Influence of a shallow p+ offset region on a novel edge termination technique using lightly doped p-rings", Semiconductor Conference, 1999. CAS '99 Proceedings. 1999 Internationa L Sinaia, Romania Oct. 5-9, 1999, Piscataway, NJ, USA, IEEE, US, vol. 1, Oct. 5, 1999 (Oct. 5, 1999), pp. 63-66, XP010364757, DOI: 10.1109/SMICND.1999.810389.

Matsushita et al, "Highly Reliable High Voltage Transistors by Use of the SIPOS Process", IEDM Technical Digest, Washington, Dec. 1975, pp. 167-170.

* cited by examiner

SEMICONDUCTOR DEVICE

RELATED APPLICATIONS

The present invention is a U.S. National Stage under 35 USC 371 patent application, claiming priority to PCT Application No. PCT/EP2021/076871, filed on Sep. 29, 2021; the entirety of which is hereby incorporated herein by reference.

TECHNICAL FIELD

The present disclosure relates to a power semiconductor device, particularly but not exclusively, the present disclosure relates to a high voltage edge termination region of a power semiconductor device.

BACKGROUND

High voltage termination structures in power devices are unstable under high temperature reverse bias (HTRB). Consequently, devices having high voltage JTE/VLD termination structures often incorporate a voltage stabilising layer in contact with the silicon substrate to harness the breakdown voltage capability.

State-of-the-art devices use an undoped polysilicon or semi-insulating polycrystalline-silicon (SIPOS) layer as a charge dissipation layer in contact with the termination structure, for voltage stabilisation. Undoped polysilicon has a high density of stacking faults that result in high leakage currents at high temperatures. SIPOS is often used as this has improved surface voltage stability and leakage current compared to undoped polysilicon; however, state-of-the-art devices using SIPOS still suffer from high leakage currents when operated at high temperatures, due to discontinuities and stacking faults (high surface state charge density (Qss)) at the interface between the silicon substrate and the SIPOS layer. These high hot leakage currents cause instabilities during HTRB and thermal runaway.

FIG. 1 shows an edge termination region of a power semiconductor device according to the state-of-the-art, such as that shown in U.S. Pat. No. 8,476,691. The edge termination region includes several p-type regions. Over the edge termination region, there is a layer of undoped polysilicon or SIPOS over a tunnelling oxide layer. The tunnelling oxide layer passivates the interface between the undoped polysilicon or SIPOS layer and the silicon substrate underneath. The layer of tunnelling oxide is thin enough that hot carriers at the interface of the underlying silicon surface and the tunnelling oxide layer can pass through the tunnelling oxide layer into the charge dissipation layer.

Matsushita et. al, "*Highly Reliable High Voltage Transistors by Use of the SIPOS Process*", IEDM Technical Digest, Washington, December 1975, 167-170 reports that the leakage current can be reduced if the oxygen concentration in the SIPOS is increased; however, if the SIPOS layer is made too resistive by excessive oxygen doping, then the breakdown voltage stability is reduced.

Further conventional devices are shown in U.S. Pat. No. 9,171,917, US 2015/0349144, U.S. Pat. Nos. 6,215,168, 5,093,693, CN102263124, and EP0693772. SIPOS is described in Aoki et al. "*Oxygen-doped Polycrystalline Silicon Films Applied to Surface Passivation*", J. 10 Electrochem. Soc. Technical Digest, March 1975, p. 82C.

It is an object of the present disclosure to provide a power semiconductor device having an edge termination region with reduced leakage current whilst maintaining breakdown voltage stability.

SUMMARY

Aspects and preferred features are set out in the accompanying claims.

According to a first aspect of the disclosure, there is provided a power semiconductor device comprising: a semiconductor substrate comprising a first region of a first conductivity type, the semiconductor substrate comprising an active region and an edge termination region surrounding the active region, wherein the edge termination region is located laterally between the active region and a side surface of the semiconductor device;

a first region of a second conductivity type located in the active region and above the first region of a first conductivity type;

an edge termination structure comprising one or more regions of a second conductivity type located in the edge termination region of the semiconductor substrate and extending to an upper surface of the semiconductor substrate;

a plurality of oxide segments located over the upper surface of the edge termination region of the semiconductor substrate, wherein the plurality of oxide segments are laterally spaced from each other; and a charge dissipation layer located over the upper surface of the edge termination region of the semiconductor substrate and the plurality of oxide segments, such that the charge dissipation layer is in contact with the upper surface of the semiconductor substrate only at a plurality of interface regions, wherein the interface regions comprise regions of the semiconductor substrate located laterally between adjacent oxide segments.

The active region may be referred to as a cell region or active device area. 'In contact' may be used to refer to direct, physical contact; however, this may also refer to electrical contact that allows carriers to pass from one region to another.

As the charge dissipation layer is in contact with the semiconductor substrate only at the plurality of interface regions, the interface area between the charge dissipation layer and the semiconductor substrate is reduced compared to conventional devices. This reduces the current leakage.

The power semiconductor device may be a diode, an IGBT, an RC IGBT, a MOSFET, or a thyristor.

The oxide segments may have a thickness of 1 μm to 4 μm. This prevents carriers from passing from the semiconductor substrate, through the oxide segments, to the charge dissipation layer.

The oxide segments may comprise an oxide layer having small openings corresponding to the interface regions.

The charge dissipation layer may comprise undoped polysilicon.

Alternatively, the charge dissipation layer may comprise semi-insulating polycrystalline silicon (SIPOS). SIPOS has improved surface voltage stability and leakage current compared to undoped polysilicon.

The SIPOS charge dissipation layer may comprise 10-25% by weight of oxygen. The low percentage of oxygen can be used to achieve the desired SIPOS resistivity without compromising the breakdown voltage stability.

The charge dissipation layer may have a thickness of 4kÅ to 6kÅ. This thickness range of the charge dissipation (SIPOS) layer provides a suitable level of resistance. A thicker charge dissipation layer would reduce resistance, and a thinner charge dissipation layer would increase resistance such that the performance of the device was affected.

Less than 30% of the surface area of the lower surface of the charge dissipation layer may be in contact with the semiconductor substrate. Less than 20% of the surface area of a lower surface of the charge dissipation area may be in contact with the semiconductor substrate. Between 8% to 20% of the surface area of a lower surface of the charge dissipation area may be in contact with the semiconductor substrate.

The oxide regions may each form a ring structure around the active area. The ring structure can be any shape, such as circle, square, or square with rounded corners. The ring structure of each oxide segment may be a continuous shape that surrounds the active area. The plurality of oxide regions may be concentric with each other.

The device may further comprise a channel stop structure located laterally between the edge termination structure and a side surface of the semiconductor device. The channel stop structure may extend to the side surface of the semiconductor device.

The channel stop structure may comprise a second region of a first conductivity type and the second region of a first conductivity type may have a higher doping concentration than the first region of a first conductivity type.

The edge termination structure may comprise a junction termination extension (JTE) or variable lateral doping (VLD) implant layer formed by one or more second regions of a second conductivity type, where the second regions of a second conductivity type may be in contact with the first region of a second conductivity type.

The JTE may comprise a plurality of second regions of a second conductivity type, wherein each second region of a second conductivity type has a different doping concentration and junction depth.

The VLD may comprise one second region of a second conductivity type, wherein the doping concentration of the second region of a second conductivity type is variable across the second region of a second conductivity type. The variation in doping concentration may be formed by multiple implant window openings, wherein the multiple implant window openings are separated by different distances. A VLD consumes less area and is therefore more area efficient than a JTE.

The JTE or VLD may have a doping concentration of $1\times10^{15}$ cm$^{-3}$ to $1\times10^{16}$ cm$^{-3}$. This may be formed by a Boron implant and a thermal anneal.

Alternatively, the edge termination structure may comprise a plurality of second regions of a second conductivity type, where the second regions of a second conductivity type may be laterally spaced from each other. The edge termination structure may further comprise a plurality of third regions of a second conductivity type having a higher doping concentration than the plurality of second regions of a second conductivity type, where each third region of a second conductivity type may be in contact with a corresponding second region of a second conductivity type.

The second regions of a second conductivity type may be located such that each second region of a second conductivity type is located at least partially below an oxide segment and a portion of the charge dissipation layer between adjacent oxide segments. The oxide segments may be located laterally between said corresponding second region of a second conductivity type and the side surface of the device. In other words, oxide segments are offset from their corresponding second region, further away from the centre of the semiconductor device. This allows the oxide segments to be located such that the interface regions are offset from a corresponding second region, towards the centre of the semiconductor device, such that the interface regions are located only at regions of electric field peak. This means that hot carriers can be dissipated through the charge dissipation layer, ensuring blocking stability under high voltage conditions such as HTRB.

Each third region of a second conductivity type may be located at an interface region. Each third region of a second conductivity type may extend in the edge termination region between two adjacent oxide regions.

The second regions of a second conductivity type may have a doping concentration of $2\times10^{15}$ cm$^{-3}$ to $1\times10^{16}$ cm$^{-3}$. The third regions of a second conductivity type may have a doping concentration of $1\times10^{18}$ cm$^{-3}$ to $1\times10^{19}$ cm$^{-3}$.

The second regions of a second conductivity type may comprise concentric ring structures surrounding the active area.

Each third region of a second conductivity type may be located laterally between said corresponding second region of a second conductivity type and the active area of the device. In other words, the third regions are offset from their corresponding second region, towards the centre of the semiconductor device. This allows the third regions to be located at locations of electric field peaks. This prevents the depletion edge during blocking from reaching the interface regions and presents surface states and non-uniformities influencing the stability of termination and HTRB performance.

The device may further comprise a nitride layer located over the charge dissipation layer.

The device may further comprise a metal layer located between the semiconductor substrate and the charge dissipation layer. This allows the charge dissipation layer to not be in direct, physical contact with the semiconductor substrate but still be in electrical contact with the semiconductor substrate. This therefore prevents the depletion edge during high voltage blocking from physically contacting the charge dissipation layer.

According to a further aspect of the present disclosure, there is provided a method of manufacturing a power semiconductor device, the method comprising:

forming a semiconductor substrate comprising a first region of a first conductivity type, the semiconductor substrate comprising an active region and an edge termination region surrounding the active region, wherein the edge termination region is located laterally between the active region and a side surface of the semiconductor device;

forming a first region of a second conductivity type located in the active region and above the first region of a first conductivity type;

forming an edge termination structure comprising one or more regions of a second conductivity type located in the edge termination region of the semiconductor substrate and extending to an upper surface of the semiconductor substrate;

forming a plurality of oxide segments located over the upper surface of the edge termination region of the semiconductor substrate, wherein the plurality of oxide segments are laterally spaced from each other; and forming a charge dissipation layer located over the upper surface of the edge termination region of the semiconductor substrate and the plurality of oxide segments, such that the charge dissipation layer is in contact with the upper surface of the semiconductor substrate only at a plurality of interface regions, wherein the interface regions comprise regions of the semiconductor substrate located laterally between adjacent oxide segments.

BRIEF DESCRIPTION OF THE DRAWINGS

Some preferred embodiments of the disclosure will now be described, by way of example only and with reference to the accompanying drawings, in which.

DETAILED DESCRIPTION OF THE PREFERRED EMBODIMENTS

Figure 1:
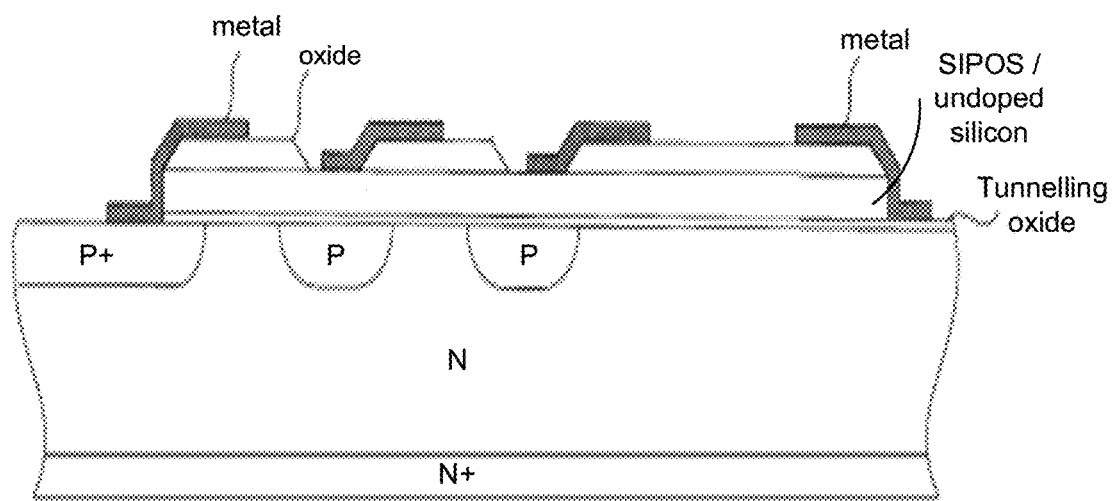
FIG. 1 illustrates an edge termination region of a power semiconductor device according to the prior art.
Figure 2:
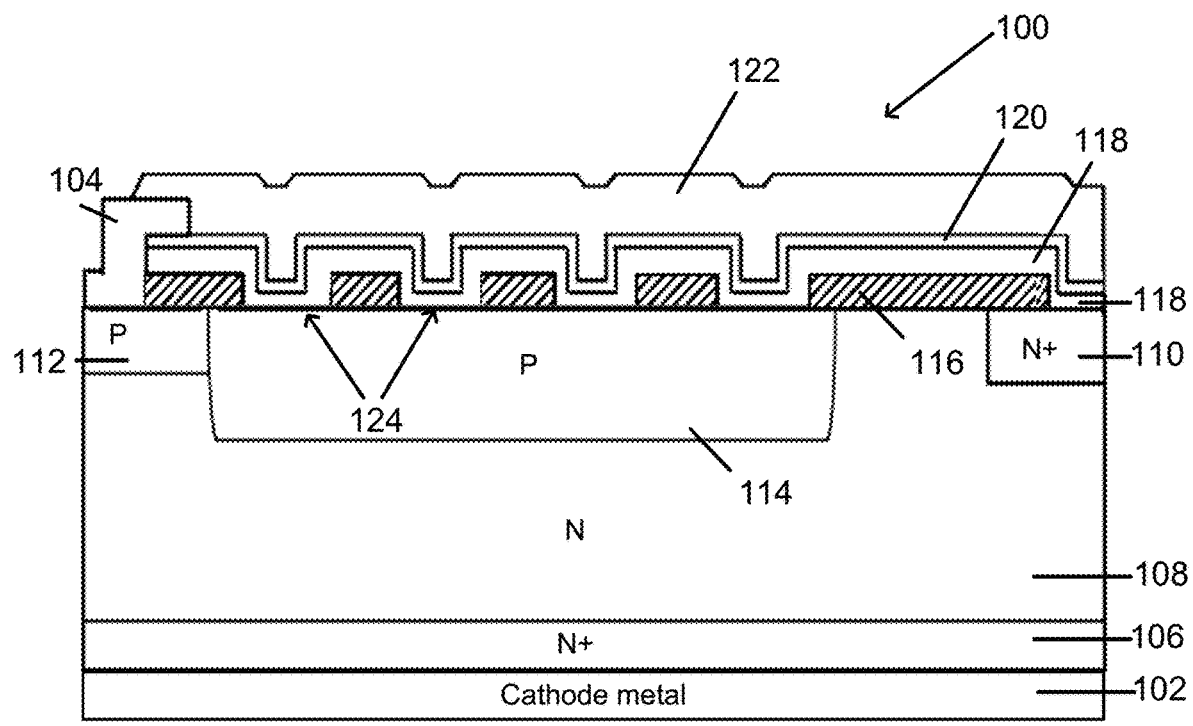
FIG. 2 illustrates a cross-section of an edge termination region of a power semiconductor device according to an embodiment of the disclosure.
Figure 3:
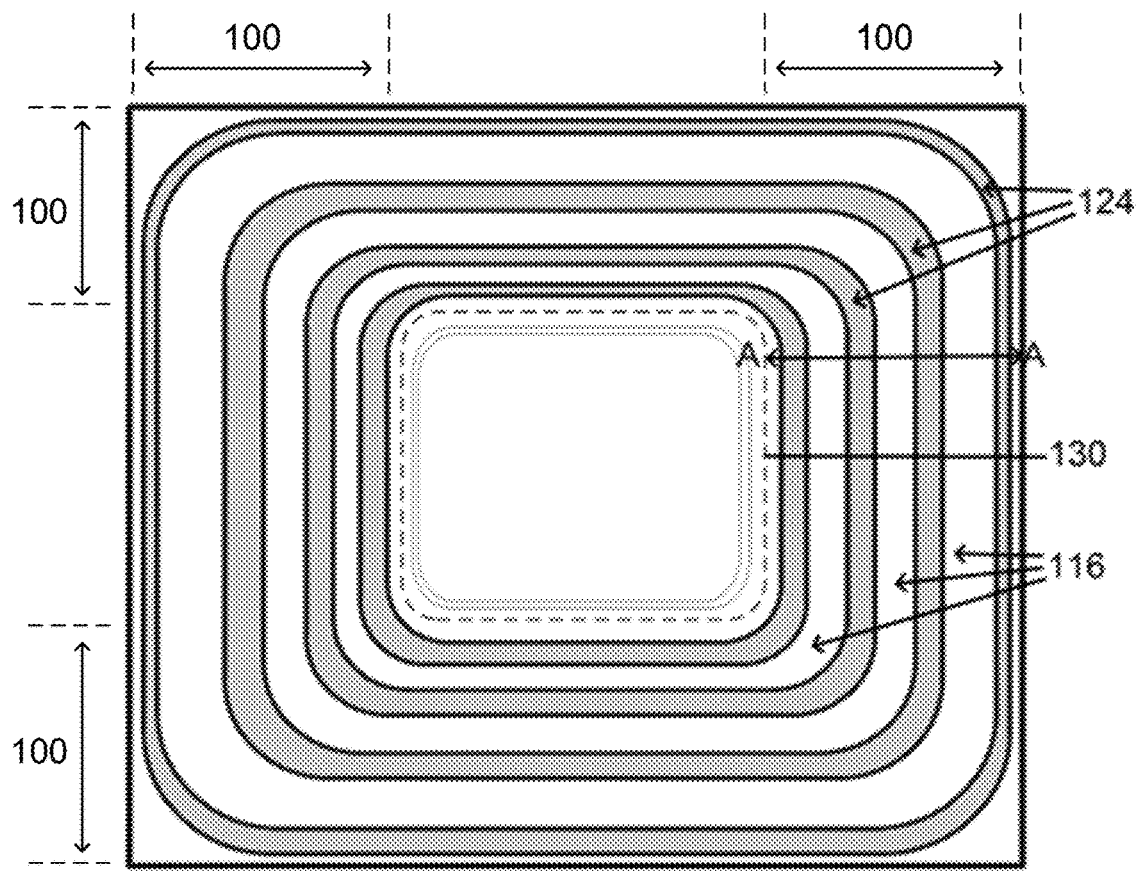
FIG. 3 illustrates a top view of the device of FIG. 2.

FIG. 2 illustrates a cross-section of an edge termination region 100 of a power semiconductor device according to an embodiment of the disclosure. FIG. 2 illustrates a cross-section through the cut-line A-A shown in FIG. 3. The device includes a semiconductor substrate, in this example the semiconductor substrate is formed of silicon although other semiconductor materials may be used. The semiconductor substrate includes two regions: an active region (not shown), which is used for current conduction, and an edge termination region. The active region is located in the centre of the semiconductor device, whilst the edge termination region surrounds the active region and is located between the active region and the side surfaces of the semiconductor device as shown in FIG. 3.

In this embodiment, the semiconductor substrate includes an n-type voltage sustaining region or n-base (or a drift region) 108 over a cathode 102. An n-type cathode layer 106 is located between the cathode 102 and the n-base region 108. Above the n-base region 108 and at an outer edge of the active region, there is a p-type body region 112 (in the case of a power MOSFET or IGBT). An anode 104 is located over the p-type body region 112, and the anode metal 104 is in contact with the SIPOS layer.

The p-type body region 112 is surrounded by an edge termination structure (also referred to a junction termination structure), which in this embodiment, includes a p-type JTE/VLD implant layer 114. The skilled person will understand that the type of power device and type of junction termination structure is exemplary and not limited to the types shown.

A channel stop region 110 is located at a side surface of the semiconductor device, at an opposite side of the edge termination region to the active region. The channel stop region 110 includes an n-type diffusion having a higher doping concentration than the drift region 108. The channel stop region 110 prevents channels being formed at the edge of the device.

A plurality of oxide segments 116 are located over and in contact with the top surface of the edge termination region of the semiconductor substrate. It will be appreciated that, whilst oxide is used in this embodiment, other insulating materials may be used. For example, the oxide segments 116 may include a stack of layers having an oxide layer as the underlying layer. The plurality of oxide segments 116 are laterally spaced from each other, between the active region and the side surface of the semiconductor device. The oxide segment 116 located closest to the active region is in contact with the p-body region 112 and the anode 104, and the oxide segment closest to the side surface of the semiconductor device is in contact with the channel stop layer 110.

The plurality of oxide segments 116 are separated such that there is a gap or space between adjacent oxide segments. A charge dissipation layer 118 is located over the semiconductor substrate and the oxide segments 116. In this example, the charge dissipation layer 118 is a SIPOS layer, although an undoped polysilicon layer may also be used. The SIPOS layer may include a triple layer structure including thick oxygen-doped polycrystalline silicon. The charge dissipation layer 118 is in contact with the top surface of the edge termination region of the semiconductor substrate at a plurality of interface regions or areas 124 corresponding to the gaps between adjacent oxide segments 118.

The oxide segments 116 have a thickness of 1 µm to 4 µm, and are sufficiently thick to prevent carriers passing from the semiconductor substrate through the oxide segments 116 to the SIPOS layer 118. This reduces the interface area between the silicon substrate and the SIPOS layer 118. Devices having this construction, of thick oxide segments 116 between the SIPOS, can be used to reduce the proportion of the lower surface of the SIPOS layer in contact with the top surface of the silicon to less than 20%.

There may be a metal layer (not shown) located between the substrate and the SIPOS layer 118. However, in this case, the substrate and SIPOS 118 would still be in electrical contact, as the conductive nature of the metal layer would allow carriers passing from the semiconductor substrate to the SIPOS layer 118. The metal layer prevents the depletion edge during high voltage blocking from touching the SIPOS layer, as the silicon substrate and the SIPOS layer would not be in direct, physical contact and there is no direct, physical interface between the silicon substrate and SIPOS layer.

A nitride layer 120 is located over the SIPOS layer 118. The nitride layer prevents moisture from getting into the termination area, which can destabilise the electric field distribution and degrade the breakdown voltage. Other materials with properties similar to nitride (for example, non-porous materials or materials which moisture cannot penetrate) may be used in the place of nitride. Other passivation layers 122, such as oxides, nitrides or polyimides, are located over the nitride layer 120. The nitride layer 120 has a thickness of 1kÅ to 2kÅ and the SIPOS layer 118 has a thickness in the range of 4kÅ to 6kÅ. The SIPOS layer 118 has doping of 10% by weight of oxygen.

FIG. 3 illustrates a top view of the device of FIG. 2, showing the active region 130 and the edge termination region 100 surrounding the active region 130. It will be appreciated that the device of FIG. 2 is a diode, however the semiconductor device could also be an IGBT in which case a gate pad area would be present.

As can be seen in FIG. 3, the oxide segments 116 may each form a ring around the active area 130 such that the plurality of oxide segments 116 form a series of concentric rings around the active area 130. The ring shape of the oxide segments 116 may be circular, oval, rectangular, square, rounded square or rectangular or any other shape that surrounds the active area 130. The ring shape of the oxide segments 116 may have an inner and outer circumference that are both a similar shape to the active area 130. The spaces between the oxide segments 116 and each corresponding interface regions 124 also have an inner and outer circumference that is a similar shape to the active area 130.

Figure 4:
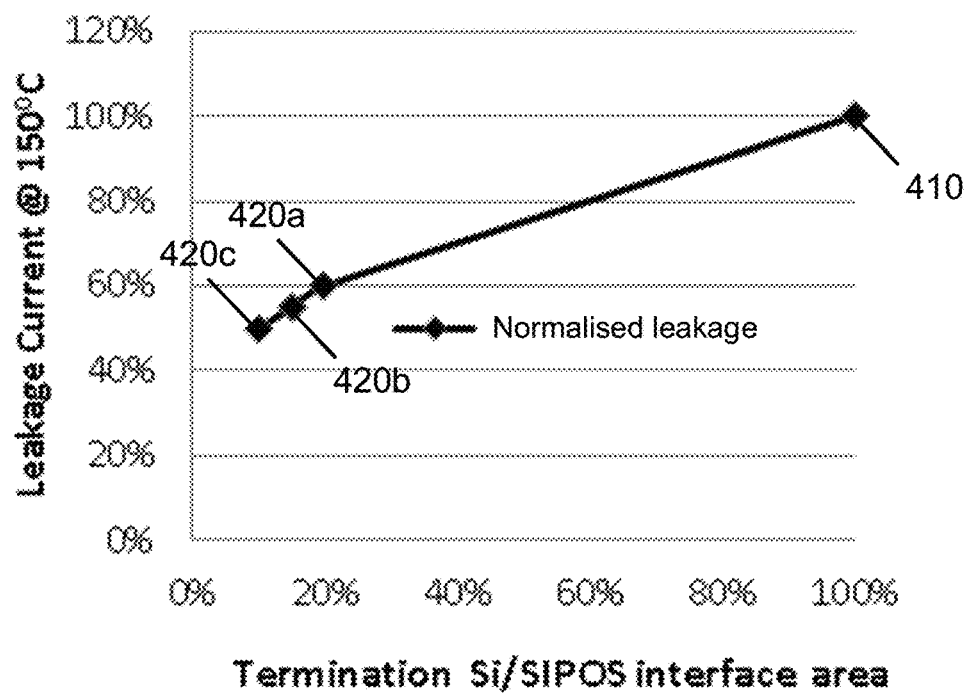
FIG. 4 shows leakage current against termination silicon to SIPOS interface area.

FIG. 4 shows leakage current at 150° C. against termination silicon/SIPOS interface area for a conventional device 410 and for three devices according to an embodiment of the disclosure 420a, 420b, 420c. The conventional device 410 has 100% termination Si/SIPOS interface area, i.e. 100% of the lower surface of the SIPOS layer is in contact with the top surface of the silicon substrate. The herein disclosed devices 420a, 420b, 420c have a reduced termination Si/SIPOS interface area compared to the conventional device 410. In this example the devices 420a, 420b, 420c have <20% of the lower surface of the SIPOS layer in contact with the top surface of the silicon substrate. This shows that the leakage current decreases with decreasing termination Si/SIPOS interface area by up to 40% at 150° C.

Figure 5:
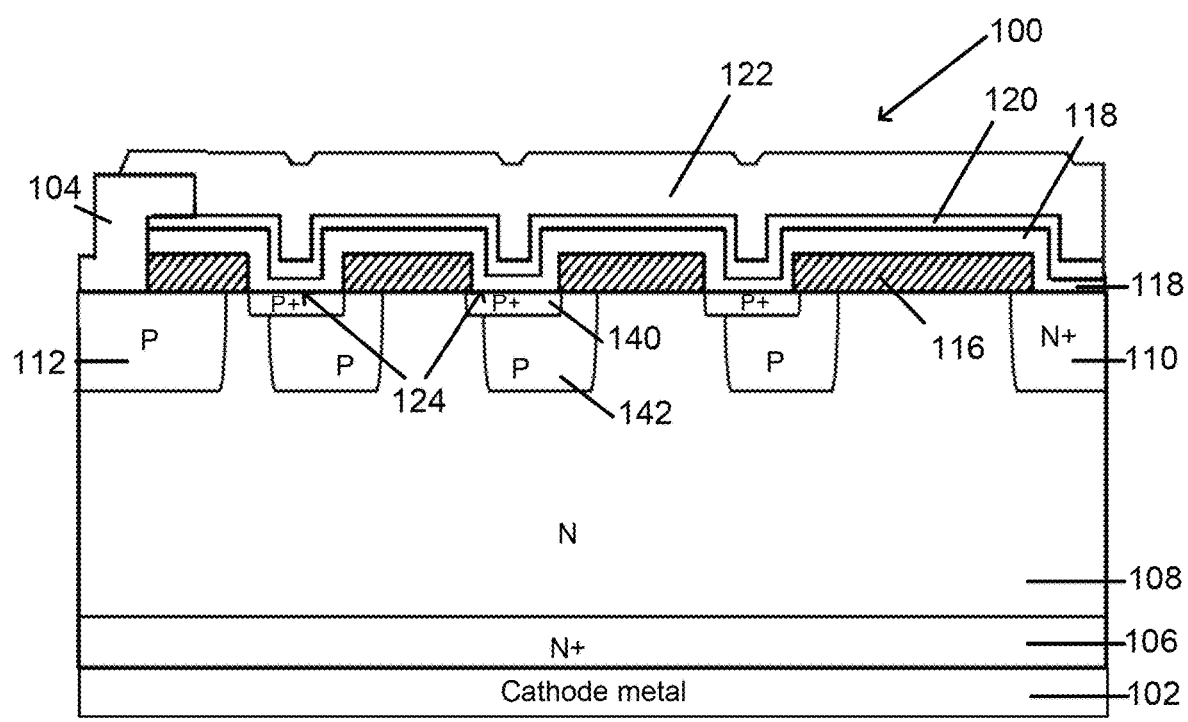
FIG. 5 illustrates a cross-section of an alternative edge termination region of a power semiconductor device according to a further embodiment of the disclosure.

FIG. 5 illustrates a cross-section of an alternative edge termination region of a power semiconductor device according to a further embodiment of the disclosure. In this embodiment, the edge termination structure includes a plurality of p-rings 142 located at the top surface of the semiconductor substrate. The top surface of each p-ring 142 is in contact with an oxide segment 116 and an interface area 124. In this example, the number of p-rings 142 corresponds to the number of oxide segments 116; however, the number of p-rings 142 may be different to the number of oxide segments 116.

In this cross-section view, the p-rings 142 appear as p-type diffusions, however in a top view they are ring shaped structures surrounding the active area of the device. The plurality of p ring structures 142 form a series of concentric rings around the active area. The ring shape of the p-rings 142 may be circular, oval, rectangular, square, rounded square or rectangular or any other shape that surrounds the active area. The ring shape of the p-rings 142 may have an inner and outer circumference that are both a similar shape to the active area.

Each p-ring 142 is connected to a p+ implant 140, also located at a top surface of the semiconductor substrate. The p-rings 142 extend a greater depth (<20 µm) into the semiconductor substrate than the p+ implants 140 (<1 µm). For this reason, the p-rings 142 are referred to as deep p-rings and the p+ implants 140 are referred to as shallow p+ implants. The p-rings 142 are lightly doped and have a surface doping of around $2 \times 10^{15}$ cm$^{-3}$ to $1 \times 10^{16}$ cm$^{-3}$. The p+ implants 140 have a higher doping concentration of around $1 \times 10^{18}$ cm$^{-3}$ to $1 \times 10^{19}$ cm$^{-3}$.

The p+ implants 140 are located at the regions of electric field peaks in the semiconductor substrate; these are offset over the inner edge of the p-rings 142. In other words, the p+ implants 140 are located on the side of the corresponding p-ring 142 closest to the active area of the device (in this figure this is shown as the left hand side). The offset of the p+ implants 140 relative to the p-rings 142 prevents the depletion edge during blocking from reaching the interface regions 124, and therefore prevents surface states and non-uniformities at the interface 124 from influencing the stability of the termination region and HTRB performance. The peak electric field occurs on the inner edge of the p-rings 142; therefore, it is advantageous for the p+ implants 140 to be located over this peak electric field region to be effective. This offset is most advantageous when the p-rings 142 are lightly doped and the depletion edge during high voltage blocking should be prevented from getting to the Si/SIPOS interface 124.

As it is desired to reduce the Si/SIPOS interface 124 area in order to reduce leakage current, the interface regions 124 are located only over the inner edge (shown in this figure as the left-hand side) of the p-ring 142 where the electric field peak occurs, so that hot carriers can still be easily dissipated through the SIPOS layer 118 despite the reduced interface area 124. This ensures blocking stability under high voltages conditions such as during HTRB.

Figure 6:
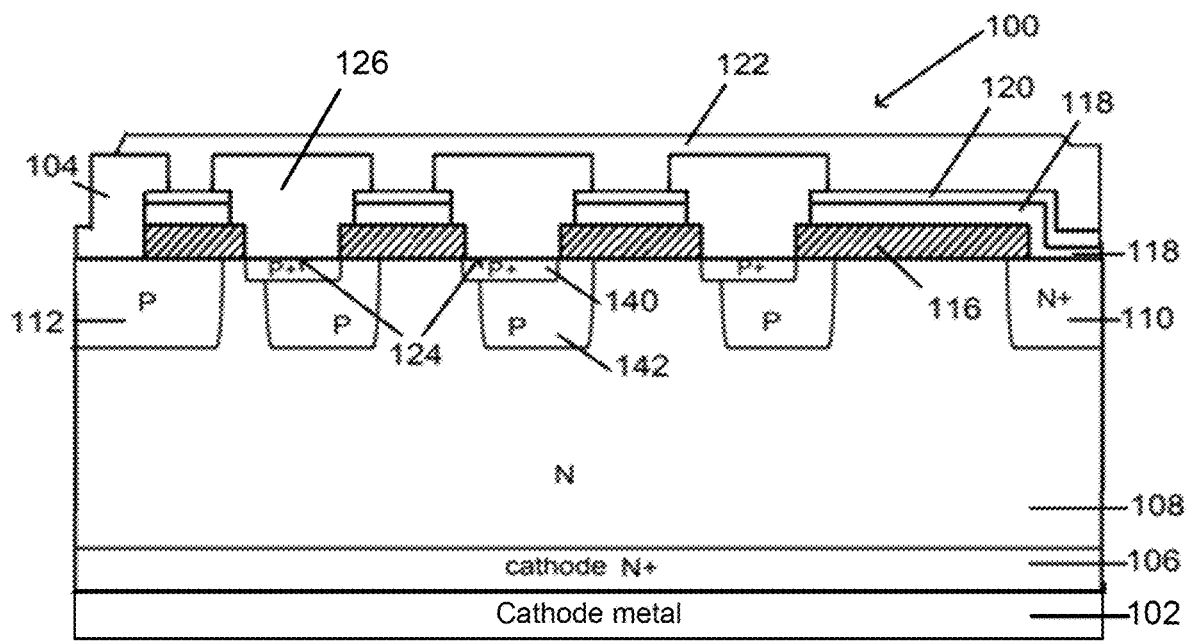
FIG. 6 illustrates a cross-section of an alternative edge termination region of a power semiconductor device according to a further embodiment of the disclosure.

FIG. 6 illustrates a cross-section of an alternative edge termination region of a power semiconductor device according to a further embodiment of the disclosure. In this embodiment, a metal layer 126 is located between the semiconductor substrate and the charge dissipation layer 118. In this example, the metal layer comprises metal structures located laterally between adjacent oxide segments 116. In this example, the SIPOS layer 118 comprises segments which are separated by the metal layer 126. The SIPOS layer 118 has an electrical connection to the silicon substrate through the sidewall contact with the metal layer 126. This allows the charge dissipation layer to not be in direct, physical contact with the semiconductor substrate but still be in electrical contact with the semiconductor substrate. This therefore prevents the depletion edge during high voltage blocking from physically contacting the charge dissipation layer. It will be appreciated that the metal layer is not limited to devices having the termination structure as shown in this figure, and that the metal layer may be used in alternative embodiments having different edge termination structures.

| List of Reference Numerals |
| --- |
| 100 Edge termination region |
| 102 Cathode metal |
| 104 Anode metal |
| 106 Cathode N+ layer |
| 108 Drift region |
| 110 Channel stop region |
| 112 p-well region |
| 114 JTE/VLD implant region |
| 116 Oxide segments |
| 118 SIPOS layer |
| 120 Nitride layer |
| 122 Passivation layer |
| 124 Silicon/SIPOS interface area |
| 126 Metal layer |
| 130 Active area |
| 140 p+ implant |
| 142 Lightly doped p-region |
| 410 Conventional device |
| 420 Semiconductor device |

The skilled person will understand that in the preceding description and appended claims, positional terms such as 'above', 'overlap', 'under', 'lateral' etc. are made with reference to conceptual illustrations of an apparatus, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

It will be appreciated that all doping polarities mentioned above could be reversed, the resulting devices still being in accordance with embodiments of the present invention.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A power semiconductor device comprising:
   a semiconductor substrate comprising a first region of a first conductivity type, the semiconductor substrate comprising an active region and an edge termination region surrounding the active region, wherein the edge termination region is located laterally between the active region and a side surface of the power semiconductor device;
   a first region of a second conductivity type located in the active region and above the first region of the first conductivity type;
   an edge termination structure comprising one or more regions of the second conductivity type located in the edge termination region of the semiconductor substrate and extending to an upper surface of the semiconductor substrate;
   a plurality of oxide segments located over the upper surface of the edge termination region of the semiconductor substrate, wherein the plurality of oxide segments are laterally spaced from each other; and
   a charge dissipation layer located over the upper surface of the edge termination region of the semiconductor substrate and the plurality of oxide segments, such that the charge dissipation layer is in contact with the upper surface of the semiconductor substrate only at a plurality of interface regions, wherein the interface regions comprise regions of the semiconductor substrate located laterally between adjacent oxide segments,
   wherein the edge termination structure further comprises:
      a plurality of second regions of the second conductivity type, wherein the second regions of the second conductivity type are laterally spaced from each other; and
      a plurality of third regions of the second conductivity type having a higher doping concentration than the plurality of second regions of the second conductivity type, wherein each third region of the second conductivity type is in contact with a corresponding second region of the second conductivity type;
   wherein the second regions of the second conductivity type are located such that each second region of the second conductivity type is located at least partially below only one oxide segment and a portion of the charge dissipation layer between adjacent oxide segments, such that each oxide segment is located laterally between the side surface of the semiconductor device and a corresponding second region of the second conductivity type, and
   wherein each third region of the second conductivity type is located at an interface region.

2. A power semiconductor device according to claim 1, wherein the oxide segments have a thickness of 1 μm to 4 μm.

3. A power semiconductor device according to claim 1, wherein the charge dissipation layer comprises undoped polysilicon.

4. A power semiconductor device according to claim 1, wherein the charge dissipation layer comprises semi-insulating polycrystalline silicon (SIPOS).

5. A power semiconductor device according to claim 4, wherein the SIPOS charge dissipation layer comprises 10-25% by weight of oxygen.

6. A power semiconductor device according to claim 1, wherein the charge dissipation layer has a thickness of 4kÅ to 6kÅ.

7. A power semiconductor device according to claim 1, wherein less than 20% of the surface area of a lower surface of the charge dissipation area is in contact with the semiconductor substrate.

8. A power semiconductor device according to claim 1, wherein the plurality of oxide segments regions form a ring structure around the active area.

9. A power semiconductor device according to claim 1, wherein the power semiconductor device further comprises a channel stop structure located laterally between the edge termination structure and a side surface of the power semiconductor device and extending to the side surface of the semiconductor device, and
   wherein the channel stop structure comprises a second region of the first conductivity type and wherein the second region of the first conductivity type has a higher doping concentration than the first region of the first conductivity type.

10. A power semiconductor device according to claim 1, wherein the edge termination structure comprises a junction termination extension (JTE) or variable lateral doping (VLD) implant layer formed by one or more second regions of the second conductivity type, wherein the second region of the second conductivity type are in contact with the first region of the second conductivity type.

11. A power semiconductor device according to claim 1, wherein the second regions of the second conductivity type have a doping concentration of $2 \times 10^{15}$ cm-3 to $1 \times 10^{16}$ cm-3, and wherein the third regions of the second conductivity type have a doping concentration of $1 \times 10^{18}$ cm-3 to $1 \times 10^{19}$ cm-3.

12. A power semiconductor device according to claim 1, wherein the second regions of the second conductivity type comprise concentric ring structures surrounding the active area.

13. A power semiconductor device according to claim 12, wherein each third region of the second conductivity type is located laterally between said corresponding second region of the second conductivity type and the active area of the power semiconductor device.

14. A power semiconductor device according to claim 1, wherein the semiconductor power device further comprises a nitride layer located over the charge dissipation layer.

15. A power semiconductor device according to claim 1, further comprising a metal layer located between the semiconductor substrate and the charge dissipation layer.

16. A method of manufacturing a power semiconductor device, the method comprising:
   forming a semiconductor substrate comprising a first region of a first conductivity type, the semiconductor substrate comprising an active region and an edge termination region surrounding the active region, wherein the edge termination region is located laterally between the active region and a side surface of the power semiconductor device;

forming a first region of a second conductivity type located in the active region and above the first region of the first conductivity type;

forming an edge termination structure comprising one or more regions of the second conductivity type located in the edge termination region of the semiconductor substrate and extending to an upper surface of the semiconductor substrate;

forming a plurality of oxide segments located over the upper surface of the edge termination region of the semiconductor substrate, wherein the plurality of oxide segments are laterally spaced from each other; and forming a charge dissipation layer located over the upper surface of the edge termination region of the semiconductor substrate and the plurality of oxide segments, such that the charge dissipation layer is in contact with the upper surface of the semiconductor substrate only at a plurality of interface regions, wherein the interface regions comprise regions of the semiconductor substrate located laterally between adjacent oxide segments;

wherein the edge termination structure further comprises:

a plurality of second regions of the second conductivity type, wherein the second regions of the second conductivity type are laterally spaced from each other; and a plurality of third regions of the second conductivity type having a higher doping concentration than the plurality of second regions of the second conductivity type, wherein each third region of the second conductivity type is in contact with a corresponding second region of the second conductivity type;

wherein the second regions of the second conductivity type are located such that each second region of the second conductivity type is located at least partially below only one oxide segment and a portion of the charge dissipation layer between adjacent oxide segments, such that each oxide segment is located laterally between the side surface of the semiconductor device and a corresponding second region of the second conductivity type, and wherein each third region of the second conductivity type is located at an interface region.

* * * * *